(12) United States Patent
Gutierrez, III et al.

(10) Patent No.: US 11,532,489 B2
(45) Date of Patent: Dec. 20, 2022

(54) PILLARED CAVITY DOWN MIS-SIP

(71) Applicant: Dialog Semiconductor (UK) Limited, London (GB)

(72) Inventors: Ernesto Gutierrez, III, Swindon (GB); Jesus Mennen Belonio, Jr., Neubiberg (DE); Eric Hu, Taichung (TW); Melvin Martin, Stuttgart (DE); Jerry Li, Taichung (TW); Francisco Vergara Cadacio, Germering (DE)

(73) Assignee: Dialog Semiconductor (UK) Limited, London (GB)

( * ) Notice: Subject to any disclaimer, the term of this patent is extended or adjusted under 35 U.S.C. 154(b) by 21 days.

(21) Appl. No.: 17/345,174

(22) Filed: Jun. 11, 2021

(65) Prior Publication Data

US 2021/0305167 A1   Sep. 30, 2021

Related U.S. Application Data

(62) Division of application No. 16/265,009, filed on Feb. 1, 2019, now Pat. No. 11,075,167.

(51) Int. Cl.
*H01L 21/48* (2006.01)
*H01L 25/16* (2006.01)
(Continued)

(52) U.S. Cl.
CPC ........ *H01L 21/4853* (2013.01); *H01L 21/481* (2013.01); *H01L 21/6835* (2013.01);
(Continued)

(58) Field of Classification Search
CPC ............... H01L 23/5389; H01L 21/481; H01L 21/4853; H01L 23/3128; H01L 23/49816;
(Continued)

(56) References Cited

U.S. PATENT DOCUMENTS 8,581,405 B2    11/2013   Dertinger et al.
9,431,335 B2    8/2016    Hu
(Continued)

OTHER PUBLICATIONS

U.S. Office Action, U.S. Appl. No. 15/718,080, Applicant: Belonio et al., dated Oct. 24, 2018, 11 pages.
(Continued)

*Primary Examiner* — Shouxiang Hu
(74) *Attorney, Agent, or Firm* — Saile Ackerman LLC; Stephen B. Ackerman; Rosemary L. S. Pike

(57) ABSTRACT

A substrate is provided having a top side and a bottom side, having redistribution layers therein, having at least one copper pillar connected to the redistribution layers on the top side and at least one copper pillar connected to the redistribution layers on the bottom side, and having at least one cavity extending partially into the bottom side of the substrate. At least one passive component is mounted onto the copper pillar on the top side and embedded in a molding compound. At least one silicon die is mounted in the cavity wherein electrical connections are made between the at least one silicon die and the at least one passive component through the redistribution layers. At least one solder ball is mounted on the at least one copper pillar on the bottom side of the substrate to provide package output.

15 Claims, 6 Drawing Sheets

(51) Int. Cl.
  *H01L 23/00* (2006.01)
  *H01L 23/498* (2006.01)
  *H01L 23/31* (2006.01)
  *H01L 25/065* (2006.01)
  *H01L 23/538* (2006.01)
  *H01L 21/683* (2006.01)

(52) U.S. Cl.
  CPC .... *H01L 23/3128* (2013.01); *H01L 23/49816* (2013.01); *H01L 23/49822* (2013.01); *H01L 23/5389* (2013.01); *H01L 24/20* (2013.01); *H01L 24/73* (2013.01); *H01L 24/92* (2013.01); *H01L 24/96* (2013.01); *H01L 25/0657* (2013.01); *H01L 25/16* (2013.01); *H01L 2224/73204* (2013.01); *H01L 2224/9211* (2013.01)

(58) Field of Classification Search
  CPC ... H01L 23/49822; H01L 24/20; H01L 24/73; H01L 24/92; H01L 24/96; H01L 25/0657; H01L 25/16; H01L 2224/73204; H01L 2224/9211; H01L 23/50; H01L 2224/131; H01L 2224/16227; H01L 2224/81011; H01L 2224/81191; H01L 2224/92125; H01L 2924/15153; H01L 2924/15192; H01L 2924/1532; H01L 23/13; H01L 2221/68345; H01L 21/6835
  See application file for complete search history.

(56) References Cited

U.S. PATENT DOCUMENTS

| | | | |
|---|---|---|---|
| 9,565,774 B2 | 2/2017 | Lee | |
| 9,659,907 B2 | 5/2017 | Zhai | |
| 9,711,502 B2 | 7/2017 | Huang et al. | |
| 9,831,195 B1 | 11/2017 | Lu | |
| 9,941,207 B2 | 4/2018 | Lin | |
| 10,163,707 B2 | 12/2018 | Chang et al. | |
| 10,170,389 B2 | 1/2019 | Groothuis et al. | |
| 10,461,052 B2 | 10/2019 | Jiang | |
| 10,636,742 B2 | 4/2020 | Belonio, Jr. | |
| 10,872,864 B2* | 12/2020 | Wang | H01L 21/56 |
| 11,075,167 B2 | 7/2021 | Gutierrez, III et al. | |
| 2016/0118333 A1* | 4/2016 | Lin | H01L 23/528 257/773 |
| 2016/0174381 A1 | 6/2016 | Lee et al. | |
| 2016/0307847 A1 | 10/2016 | Lee et al. | |
| 2017/0338205 A1 | 11/2017 | Sung | |
| 2018/0197821 A1 | 7/2018 | Shin | |
| 2018/0358298 A1 | 12/2018 | Zhai | |
| 2019/0006223 A1 | 1/2019 | See et al. | |
| 2019/0355680 A1 | 11/2019 | Chuang | |
| 2020/0035625 A1 | 1/2020 | Wang | |
| 2020/0058627 A1* | 2/2020 | Chen | H01L 23/3135 |

OTHER PUBLICATIONS

U.S. Office Action, U.S. Appl. No. 15/718,080, Applicant: Belonio et al., dated Mar. 27, 2019, 6 pages.

U.S. Office Action, U.S. Appl. No. 15/718,080, Applicant: Belonio et al., dated Jul. 10, 2019, 8 pages.

U.S. Notice of Allowance, U.S. Appl. No. 15/718,080, Applicant: Belonio et al., dated Dec. 26, 2019, 5 pages.

U.S. Office Action, U.S. Appl. No. 16/265,009, Applicant: Gutierrez et al., dated Jun. 10, 2020, 10 pages.

U.S. Office Action, U.S. Appl. No. 16/265,009, Applicant: Gutierrez et al., dated Nov. 30, 2020, 10 pages.

U.S. Notice of Allowance, U.S. Appl. No. 16/265,009, Applicant: Gutierrez et al., dated Mar. 17, 2021, 4 pages.

* cited by examiner

PILLARED CAVITY DOWN MIS-SIP

This is a divisional of U.S. patent application Ser. No. 16/265,009; filed on Feb. 1, 2019, assigned to the same assignee as the present disclosure, and herein incorporated by reference in its entirety.

RELATED PATENT APPLICATION

This disclosure is related to U.S. patent application Ser. No. 15/718,080 filed on Sep. 28, 2017, assigned to the same assignee as the present disclosure, and herein incorporated by reference in its entirety.

(1) TECHNICAL FIELD

This disclosure is related to integrated circuits (IC's) packaging, and more particularly, to improved IC systems in package (SiP).

(2) BACKGROUND

System in Package (SiP) is one of the advanced packaging technologies that is increasing rapidly in popularity for wearables and Internet of Things (IoT) due to its advantages of heterogeneous integration, miniaturization, and reduced development cost and time. Related patent application Ser. No. 15/718,080 described a SiP using, for example, an embedded trace substrate (ETS). The SiP-ETS is a double sided SiP assembly composed of surface mount technology (SMT) passive components on the top side of the package, the ETS substrate in the middle, and a power management integrated circuit (PMIC) chip at the backside. The module interconnection is done at the bottom side of the substrate with a bottom side molding with Through mold via (TMV) and directly dropping a solder ball into the via hole to form the solder bump that will serve as the external connection of the package. The SiP-ETS is one of the thinnest double-sided packages on the market and that comes with a very complex and technically challenging manufacturing process.

Some of the technical challenges include: p 1. The SiP-ETS substrate is about 85 μm thick and is considered the thinnest of its kind. As a result, it will require a metal carrier and/or stiffeners in most of the manufacturing steps. Substrate strip loading/unloading is an additional cost in terms of logistics, non-value-added handling steps (strip load/unload), and customized equipment automation (loader and unloader handlers).

2. The passive component Stand off height (SOH) for proper mold underfilling (MUF) is a concern. Tight SMT component to component design rules limit the solder paste thickness to achieve a higher SOH. Replacing the top side metal finish with a thick Electroless nickel immersion gold (ENIG) layer also has disadvantages, including:

a. Non-planar SMT pad surface "Mushroom effect"
b. Plated Ni and Au are more expensive materials than Cu.

3. SiP-ETS using TMV is currently considered one of the bottleneck processes in backend assembly since it is a very slow process (laser drilling every individual hole) and requires very expensive equipment.

Several U.S. Patents and Patent Applications discuss various packaging methods. These include U.S. Pat. No. 10,170,389 (Groothuis et al), U.S. Pat. No. 10,163,707 (Chang et al), U.S. Pat. No. 9,941,207 (Lin), and U.S. Pat. No. 9,831,195 (Lu) and U.S. Patent Application 2019/0006223 (See et al).

SUMMARY

It is the primary objective of the present disclosure to provide an improved IC System in Package (SiP).

It is a further objective of the present disclosure an improved SiP without need for a substrate carrier or stiffener.

Yet another objective is to provide an improved SiP with copper pillars instead of through mold via (TMV) connections.

A still further objective is to provide an improved SiP using a mold integrated substrate (MIS).

In accordance with the objectives of the present disclosure, a robust IC packaging process window is achieved. A system in package comprises a substrate having a top side and a bottom side, having redistribution layers therein, having at least one copper pillar connected to the redistribution layers on the top side and at least one copper pillar connected to the redistribution layers on the bottom side, and having at least one cavity extending partially into the bottom side of the substrate. At least one passive component is mounted on the at least one copper pillar on the top side of the substrate and embedded in a first molding compound and at least one silicon die is mounted in the cavity on the bottom side of the substrate wherein electrical connections are made between the at least one silicon die and the at least one passive component through the redistribution layers.

Also in accordance with the objectives of the present disclosure, a method of forming integrated circuit packages is achieved. A substrate is provided having a top side and a bottom side, having redistribution layers therein, having at least one copper pillar connected to the redistribution layers on the top side and at least one copper pillar connected to the redistribution layers on the bottom side, and having at least one cavity extending partially into the bottom side of the substrate. At least one passive component is mounted onto the at least one copper pillar on the top side of the substrate wherein the at least one passive component electrically contacts the redistribution layers. The least one passive component is embedded in a molding compound wherein the molding compound is ground to a desired thickness. At least one silicon die is mounted in the cavity in the bottom side of the substrate wherein electrical connections are made between the at least one silicon die and the at least one passive component through the redistribution layers. At least one solder ball is mounted on the at least one copper pillar on the bottom side of the substrate wherein the at least one solder ball provides package output.

Also in accordance with the objects of the present disclosure, a method to fabricate a mold interconnect substrate for use in a system in package is achieved. Redistribution layers are built up in a substrate. On a top side of the substrate, via openings are formed to a topmost redistribution layer. Thereafter, a first dry film is laminated on the top side of the substrate. The first dry film is exposed and developed to provide first openings to the via openings. First copper pillars are plated in the first openings wherein the first copper pillars connect to the topmost redistribution layer. Thereafter the first dry film is ground to flatten the first copper pillars. The dry film is removed. A second dry film is laminated on a bottom side of the substrate. The second dry film is exposed and developed to provide second openings to a bottommost redistribution layer. Second copper pillars are plated in the second openings wherein the second copper pillars connect to the bottommost redistribution layer. Thereafter the second dry film is removed. A molding layer is coated over the second copper pillars. The molding layer is ground to flatten and expose the copper pillars. At least one cavity is drilled into the molding layer contacting the bottommost redistribution layer to complete the mold interconnect substrate.

BRIEF DESCRIPTION OF THE DRAWINGS

In the accompanying drawings forming a material part of this description, there is shown.

DETAILED DESCRIPTION

Figure 1:
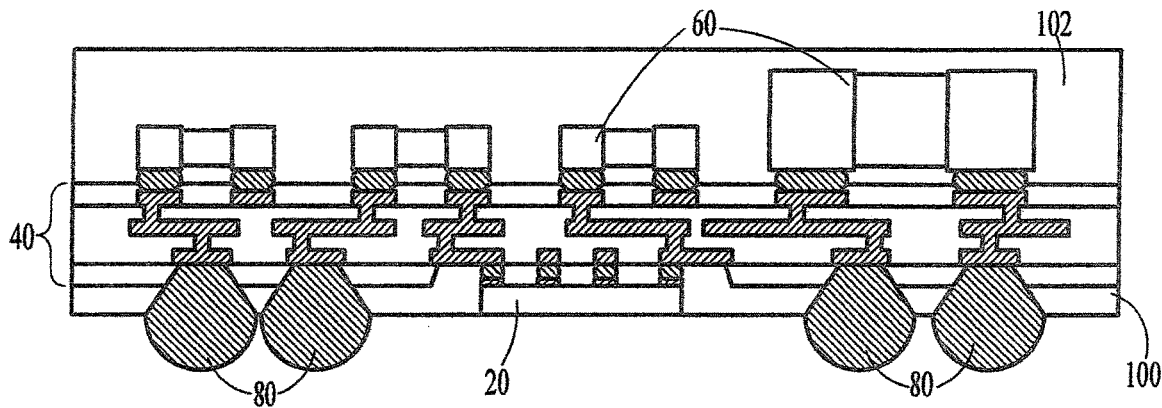
FIG. 1 is a cross-sectional representation of a SiP of the prior art.

FIG. 1 illustrates the ETS-SiP of co-pending U.S. patent application Ser. No. 15/718,080. Substrate 40 is, for example, an embedded trace substrate (ETS). On the top side are SMT passive components 60 covered by top molding compound 102. On the bottom side is PMIC chip 20. Bottom molding compound 100 has been ground to expose the chip 20 and through mold vias have been etched and then filled with solder balls 80.

Figure 2:
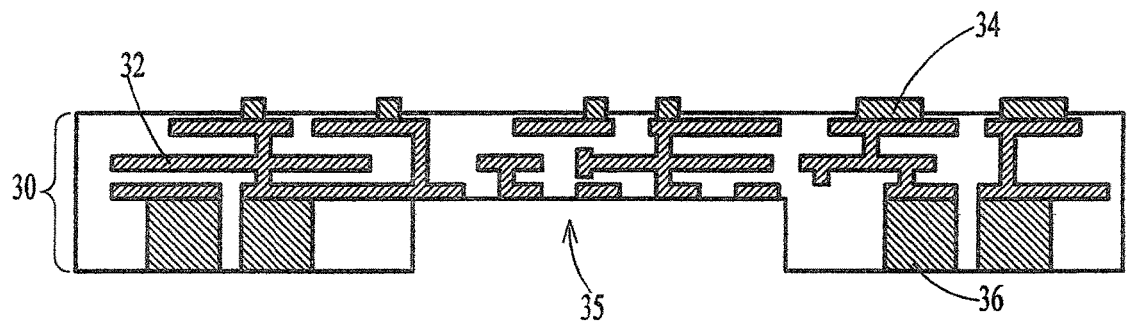
FIG. 2 is a cross-sectional representation of a mold interconnect substrate (MIS) in a preferred embodiment of the present disclosure.

A key feature of the present disclosure is the Mold interconnect Substrate (MIS). A MIS substrate can replace an ETS or any fiber type substrate. The present disclosure describes a different approach in MIS to provide a modified and more robust MIS to achieve the MIS-SiP structure. The MIS-SiP comprises a tall Cu pillar 34 on the top side, the interconnect layers 32 in the middle and the bottom side with a cavity 35 and thick Cu via/post 36 as shown in FIG. 2.

Figure 3:
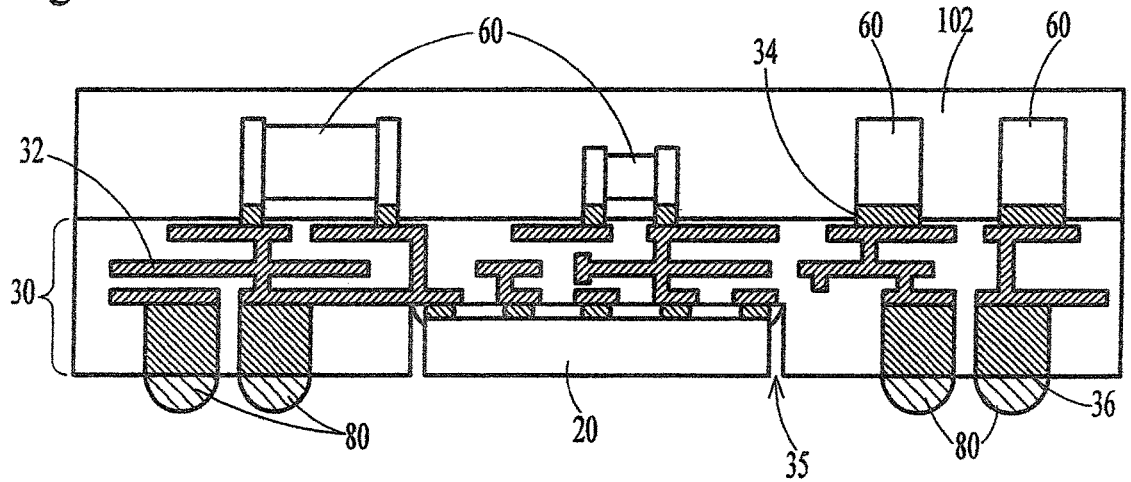
FIG. 3 is a cross-sectional representation of a SiP in a preferred embodiment of the present disclosure.

As shown in FIG. 3, the top Cu pillar 34 will be the landing pad for the passive SMT components 60 and will ensure at least 20 μm of SOH for proper mold underfill. The middle of the MIS 30 will be the standard substrate interconnect. The bottom side has cavity 35 for the flip chip die interconnect 20 and thick Cu post 36 (80 μm thick) to serve as the connection to the external board. As a result, the MIS structure doubles the thickness of the former ETS substrate 40 (from 85 μm to 165 μm) and that will address one of the prior art concerns; i.e. very thin substrate handling.

Figure 4:
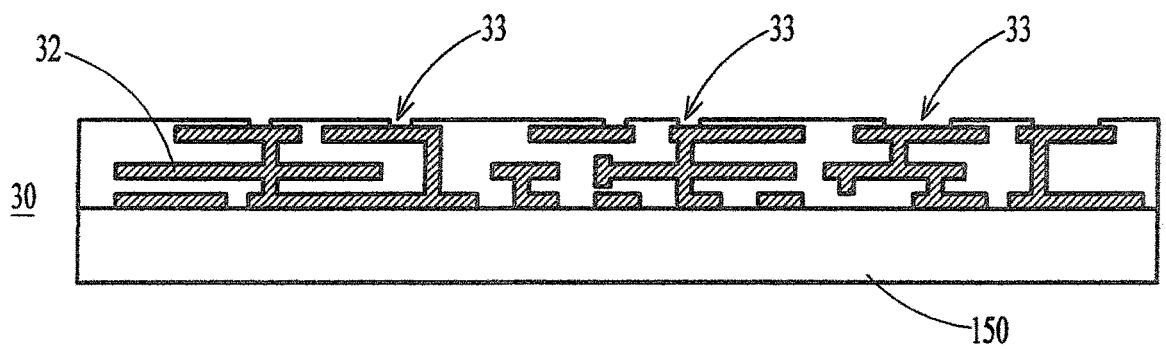
FIGS. 4-10 are cross-sectional representations of steps in the process to manufacture a Mold Interconnect Substrate (MIS) in a preferred embodiment of the present disclosure.

The MIS-SiP structure sounds simple, but the substrate fabrication process will require additional steps as described with reference to FIGS. 4-10. Referring now more particularly to FIG. 4, the MIS 30 is shown on a metal carrier 150. The middle layer 30 has been built up to include three metal redistribution layers 32 within the mold compound substrate, but there is no limit to the number of metal layers that can be provided in the substrate. Via openings 33 to the top metal layer 32 can be made by laser drilling to expose landing pads for future component connection or the top metal layer may be exposed on the surface of the MIS.

Figure 5:
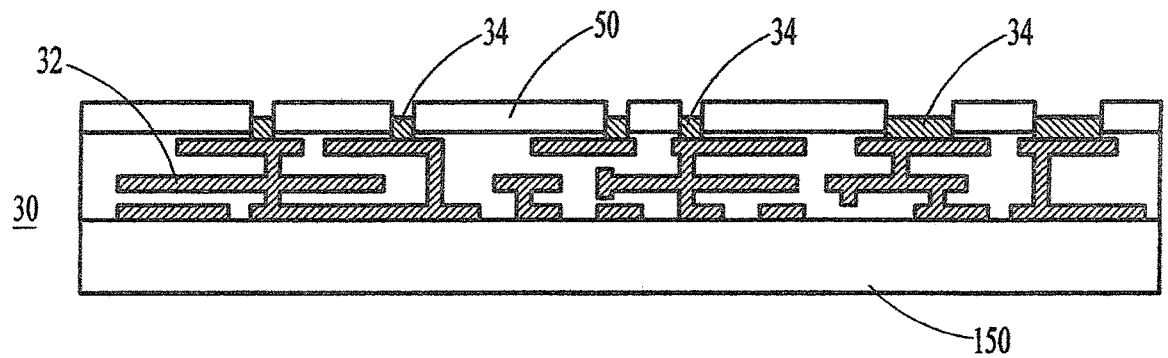
Figure 6:
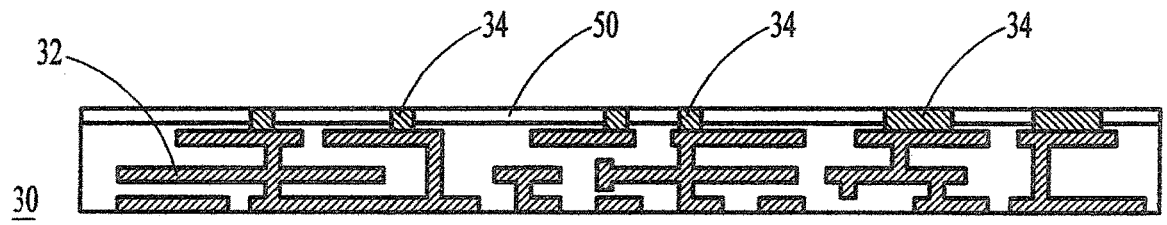

Now, a thick dry film lamination is performed on top of the completed metal layers 32. The dry film 50 will have a thickness of between >=20 μm. The dry film 50 is exposed and developed to provide openings over the via openings 33. Cu is plated in the dry film openings to form Cu pillars 34, as shown in FIG. 5. The top Cu pillar thickness should be at least 20 μm. Next, as illustrated in FIG. 6, the dry film 50 is ground to the level of the copper pillars. This provides flat copper pillars with no mushroom effect. The carrier 150 is now removed.

Figure 7:
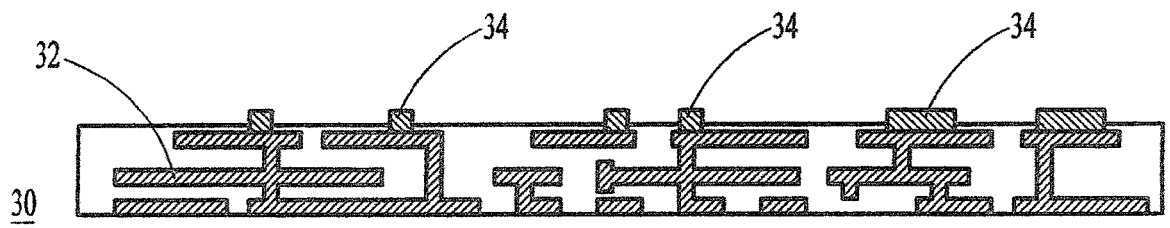
Figure 8:
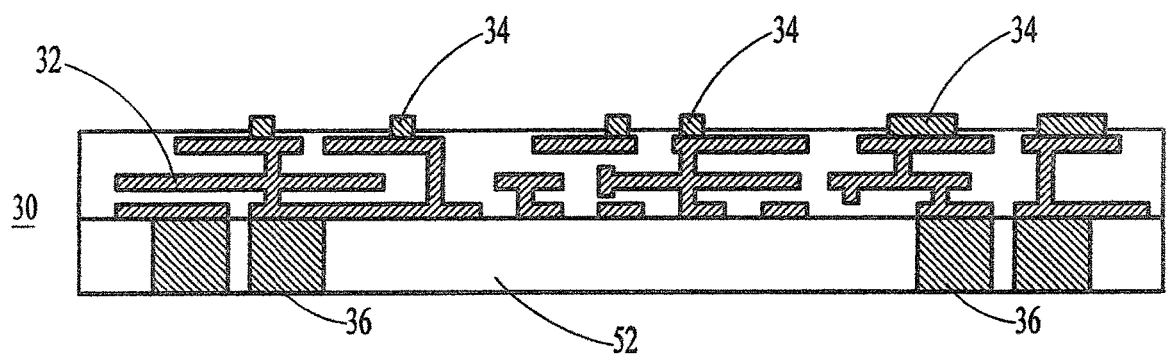
Figure 9:
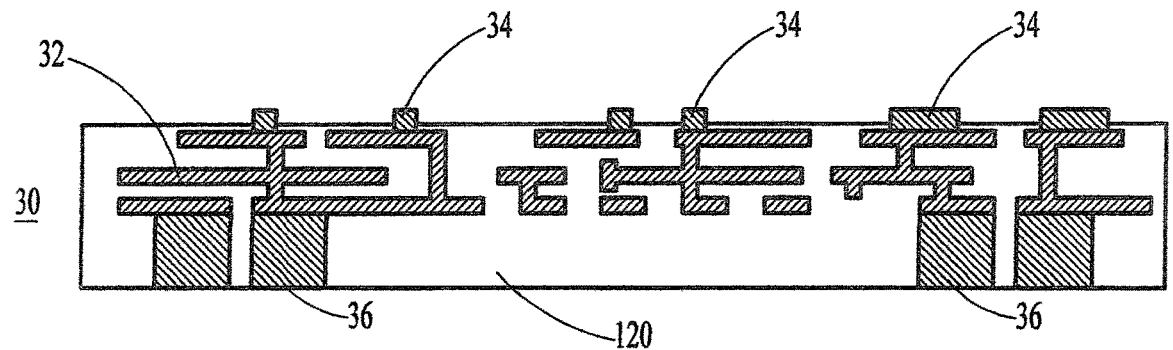
Figure 10:
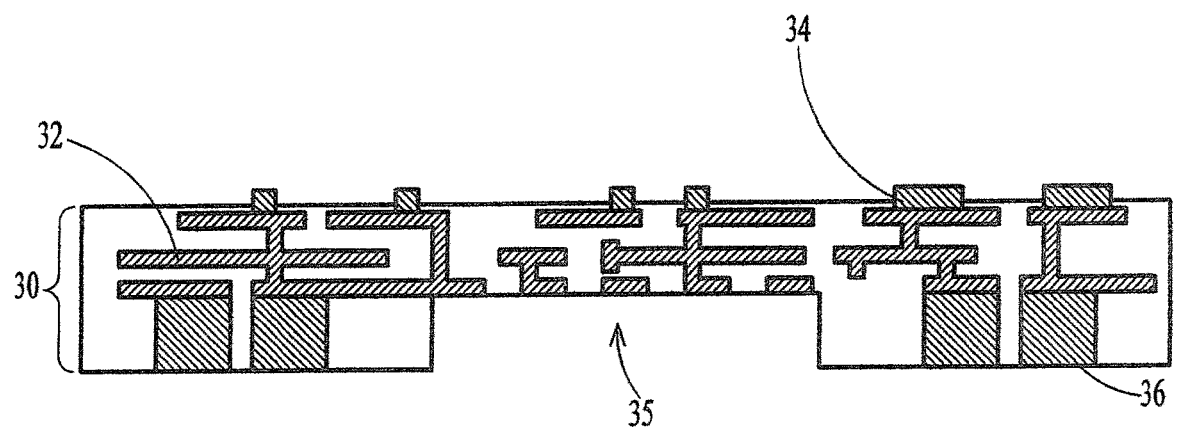
Figure 11:
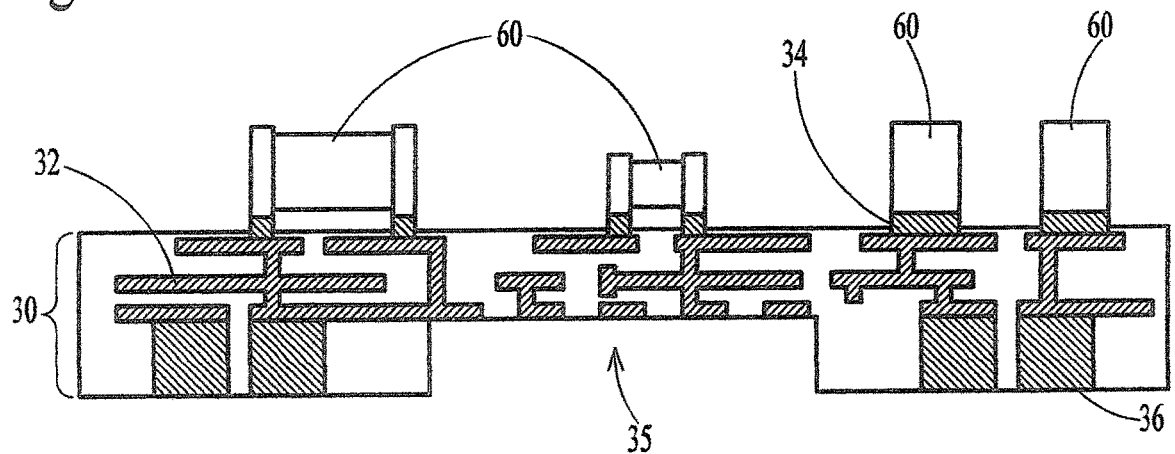
FIGS. 11-17 are cross-sectional representations of steps in the process to form a SiP using the MIS in a preferred embodiment of the present disclosure.

Referring now to FIG. 7, the dry film 50 is removed, typically by chemical stripping. Now, in FIG. 8, a dry film 52 is laminated on the bottom side. The dry film is exposed and developed to form openings to the bottommost metal layer 32. Copper is plated into the openings to form bottom side Cu pillars 36 having a thickness of at least 80 μm. The dry film 52 is removed by chemical stripping, for example, and a bottom side molding 120 is applied to overmold the bottom via/post, as shown in FIG. 9. Both the top and bottom side pillars, 34 and 36, respectively, are planarized by a back grinding process. Now, as shown in FIG. 10, a bottom side cavity 35 is formed through the molding 120 and contacting the bottommost metal layer 32, using a chemical or laser etching process. The MIS manufacturing process can utilize molded panel or quarter molded panel assembly for higher density production which can further reduce unit cost. Alternatively, panel level assembly can be utilized.

Another key feature of the present disclosure is the adaptability of the MIS-SiP package in the assembly process. The process of the present disclosure was designed to adapt (plug and play) to the existing assembly process of the SiP-ETS, but without the need for rigid carrier loading/unloading steps that are required for the very thin ETS substrate. The process of the present disclosure will significantly eliminate assembly process steps and reduce cycle time by skipping three major process steps; i.e., bottom mold, bottom mold grinding, and TMV-Laser ablation. As a result, the process of the present disclosure will be able to increase yield, reduce cycle time, and avoid high capital expenditure.

Figure 12:
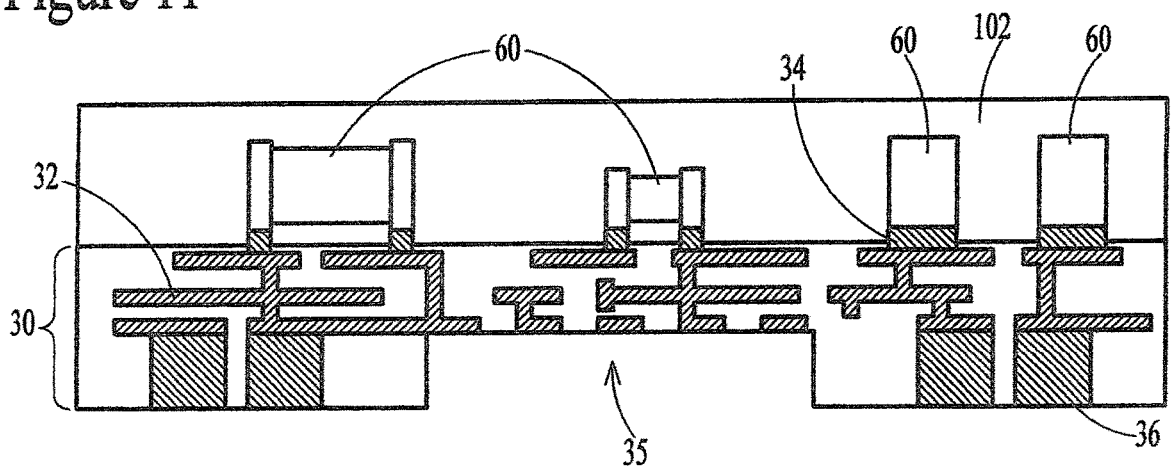
Figure 13:
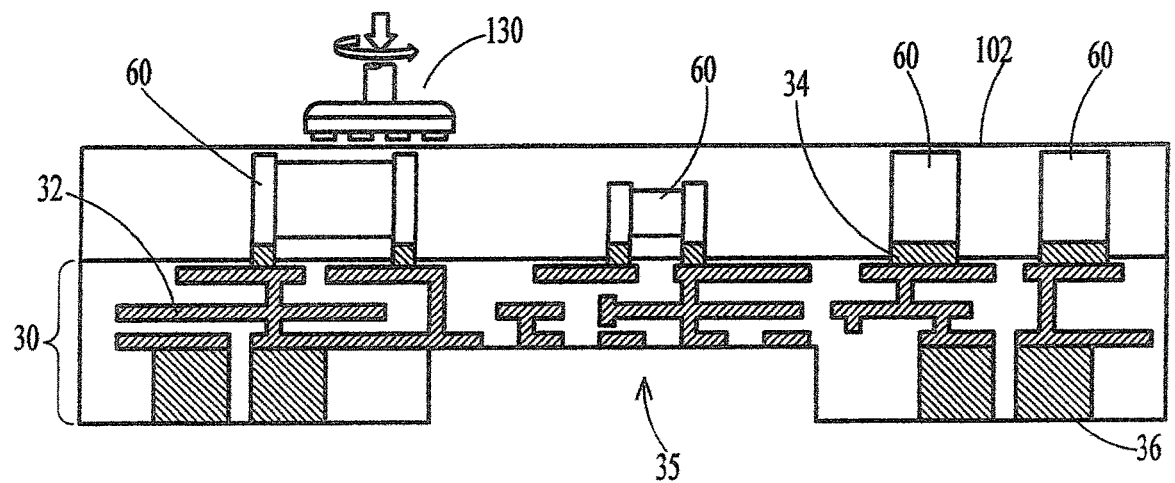

The SiP assembly process of the present disclosure will be described with reference to FIGS. 11-17. The assembly process flow, using the same current strip size as the SiP-ETS, will be plug-and-play to the current manufacturing line of SiP-ETS. Assembly will begin with Top side SMT to mount components 60 to the Cu pillars 34 on the MIS 30. Unlike with the thinner ETS, no carrier is required for the MIS 30. Now, as shown in FIG. 12, top molding compound 102 is applied over the components 60. Top side grinding 130 is performed to grind the molding 102 to the desired height, as shown in FIG. 13.

Figure 14:
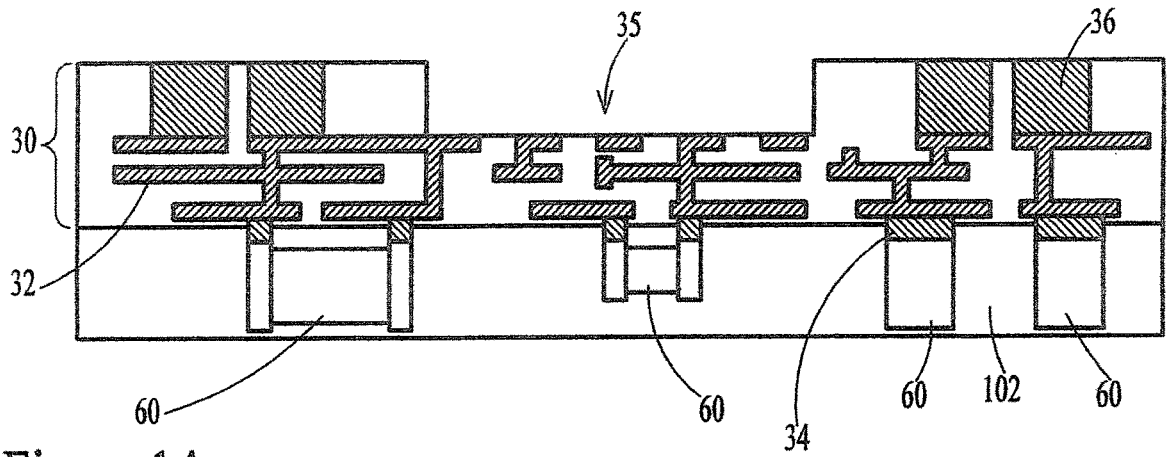
Figure 15:
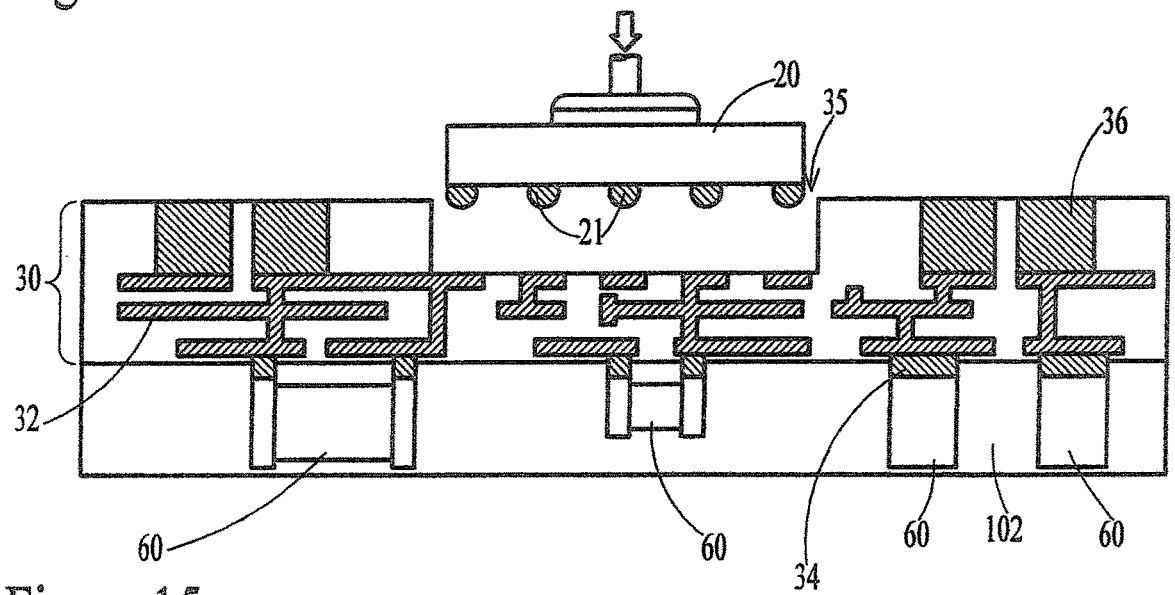

Now, as illustrated in FIG. 14, the molded strip 30 will be flipped and made ready for the bottom side assembly. As shown in FIG. 15, the die 20 is flip chip attached into the cavity 35. In an optional No Flow Underfill process, the connections 21 on the Cu pillar die 20 are dipped into a pool of no flow underfill flux and then attached to the metal layers at the bottom of the cavity 35. The no flow underfill flux serves a dual purpose: 1) to activate solder and 2) to form a benign protective material to protect the flip chip bumps 22 after solder reflow.

Figure 16:
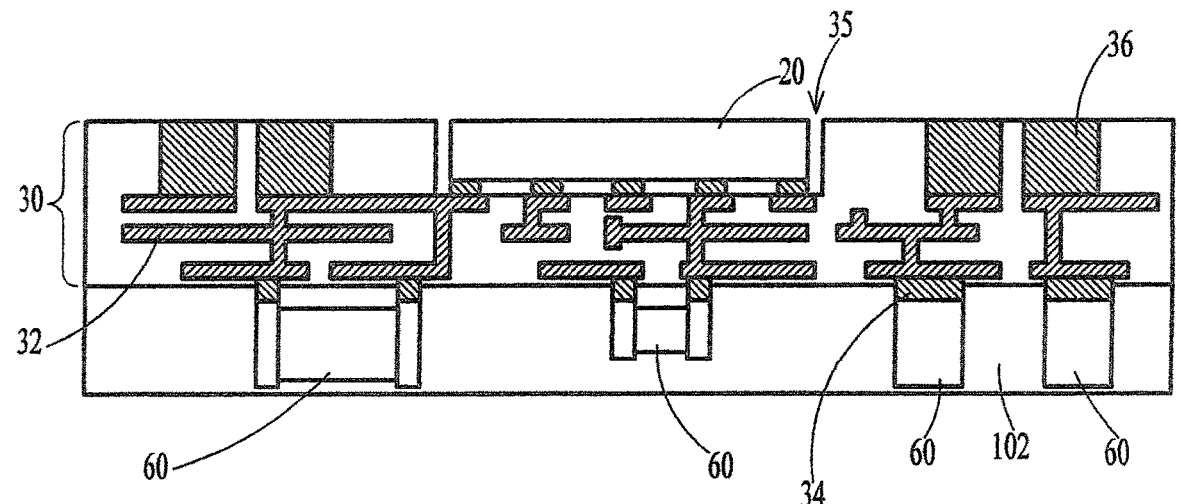
Figure 17:
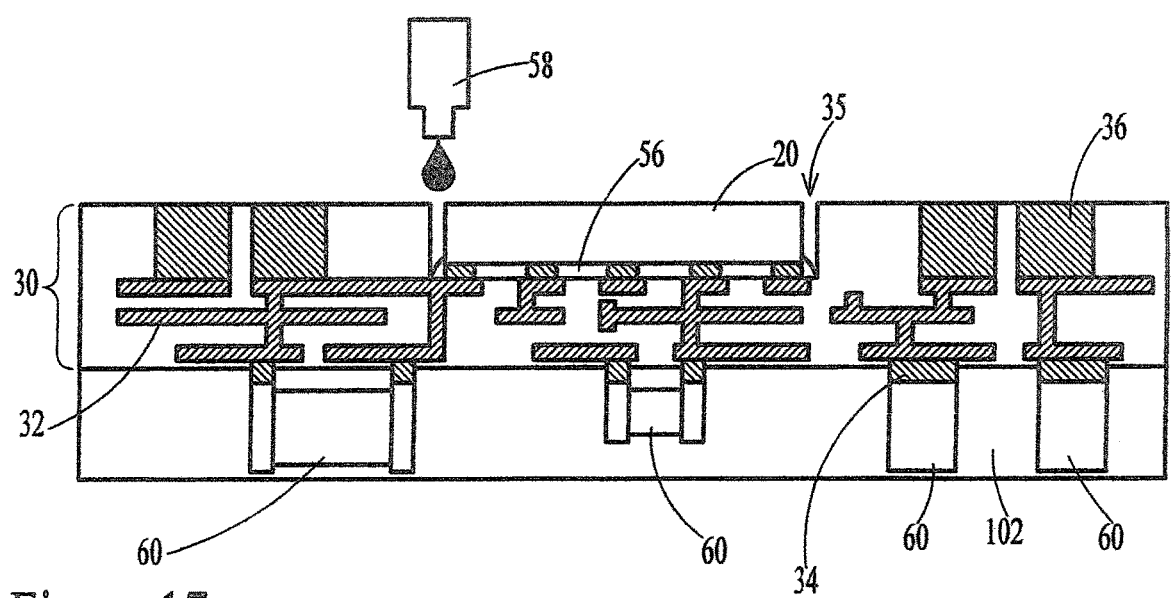

Referring now to FIG. 16, the flip chip die 20 is attached into the cavity 35 using the No Flow Underfill 56 or using ordinary solder paste/flux. If ordinary solder paste/flux is used in the chip attach and it is desired to further enhance the solder joint reliability, optionally a capillary jet underfill (UF) 58 for the flipchip die is performed. Jetting UF will be faster and can fill in through tighter gaps than normal needle dispensed capillary underfill 56, as shown in FIG. 17. If Jetting UF is not used, normal underfill 56 is dispensed at this point.

Next, solder bumps 80 are formed either by solder dome (solder printing) or BGA type ball drop and reflow. Optionally the package could skip solder bumps and be like a land grid array (LGA) package with the exposed Cu landing 36 pads. Final steps are package singulation (dicing), final test, and pack and ship. The completed package is as illustrated in FIG. 3 with solder ball package output 80 or as illustrated in FIG. 17 with landing pads 36.

In summary, the Pillared Cavity Down MIS-SiP Structure of the present disclosure will be able to eliminate at least three major process steps; i.e. 1) Bottom molding, 2) bottom mold grinding and 3) Laser ablation—TMV. These three steps are major bottlenecks, yield killers, and the slowest and most expensive processes in the assembly. Furthermore, it is highly likely that the process of the present disclosure will not require a metal strip carrier in each of the process steps. Handling processes and handler equipment will also be eliminated since the substrate will be a thicker substrate (85 µm vs 165 µm).

The current SiP-ETS version has three different layers i.e. top overmolded passive components, substrate ETS in the middle (epoxy+glass fiber+Cu) and bottom mold. That will result in a mismatch of the coefficient of thermal expansion (CTE) and will result in high package warpage and reliability risk. The MIS-SiP of the present disclosure will be a more homogenous structure of mold and Cu only, no glass fiber or epoxy.

Currently, there is a limitation on the thinness of the SiP-ETS. Since the ETS is built using a pre-preg material as a base, the limitation is the thickness of the pre-preg material. For the SiP-MIS of the present disclosure, there is no limitation since the MIS uses a mold process to create the dielectric of the substrate and can customize the mold thickness.

Since the MIS uses a mold material on the top and bottom layers rather than the solder mask of the ETS, the MIS will have a higher heat dissipation and thus, better thermal conductivity, leading to improved performance. Furthermore, the mold material used in the MIS can achieve a higher level of moisture sensitivity (MSL1); that is, essentially unlimited floor life. A Bismaleimide-Triazine (BT) base polymeric substrate like ETS is normally rated MSL3, which may mean a 7 day floor life.

The MIS with top Cu pillar 34 will guarantee at least 20 µm SOH which will be more than enough for MUF. The current thick ENIG process now only achieves a nominal 12-14 µm due to the technically challenging Ni plating which results in yield loss, solder resist (SR) damage, and leaching problems. The Cu pillar is also flat compared to non-planar Ni plating. Increasing the plated Ni increases the mushroom effect which will increase the SMT pad width. A side effect will be the reduction of the component pad to pad spacing, potentially causing SMT component to component shorting. The reduced process flow and faster assembly cycle time of the process of the present disclosure will result in reduced unit cost.

The completed Pillared Cavity down MIS-SiP structure as illustrated in FIG. 2 comprises a top side with passive/active SMT components 60 and top EMC mold 102. The second layer is the MIS substrate 30 which has a double thick Cu pillar 34 under the top SMT>20 µm and a bottom side Cu pillar 36 of about 80 µm which eliminates the need for through mold via (TMV). The cavity 35 at the bottom is the pocket for the flip chip active die 20; e.g., PMIC chip or application-specific integrated circuit (ASIC chip).

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method to fabricate a system in package comprising:
   providing a substrate having a top side and a bottom side, having copper redistribution layers therein, having at least one first copper pillar connected to said copper redistribution layers on said top side and at least one second copper pillar connected to said copper redistribution layers on said bottom side, and having at least one cavity extending partially into said bottom side of said substrate;
   mounting at least one passive component onto said at least one first copper pillar on said top side of said substrate wherein said at least one passive component electrically contacts said copper redistribution layers;
   embedding said at least one passive component in a molding compound;
   grinding said molding compound to a desired thickness;
   mounting at least one silicon die having a top side and a bottom side in said cavity in said bottom side of said substrate wherein electrical connections are made between said top side of said at least one silicon die and said at least one passive component through said copper redistribution layers and wherein said bottom side of said at least one silicon die is exposed at a bottom of said package; and
   mounting at least one solder ball on said at least one second copper pillar on said bottom side of said substrate wherein said at least one solder ball provides package output.

2. The method according to claim 1 wherein said substrate is a mold interconnect substrate.

3. The method according to claim 1 wherein said at least one first copper pillar has a height of at least 20 µm and wherein said at least one second copper pillar has a height of at least 80 µm.

4. The method according to claim 1 wherein said at least one cavity is formed by chemical or laser drilling.

5. The method according to claim 1 wherein said mounting said at least one silicon die uses no flow underfill flux.

6. The method according to claim 1 after said mounting said at least one silicon die, further comprising applying underfill into said cavity between said at least one silicon die and said copper redistribution layers.

7. A method to fabricate a mold interconnect substrate for use in a system in package comprising:
   building up redistribution layers in a mold substrate;
   on a top side of said substrate, forming via openings to a topmost said redistribution layer;
   thereafter laminating a first dry film on said top side of said substrate;
   exposing and developing said first dry film to provide first openings to said via openings;
   plating first copper pillars in said first openings wherein said first copper pillars connect to said topmost redistribution layer;
   thereafter grinding said first dry film to flatten said first copper pillars and removing said dry film;
   laminating a second dry film on a bottom side of said substrate;
   exposing and developing said second dry film to provide second openings to a bottommost said redistribution layer;
   plating second copper pillars in said second openings wherein said second copper pillars connect to said bottommost redistribution layer;

thereafter removing said second dry film;

thereafter coating a molding layer over said second copper pillars;

grinding said molding layer to flatten said copper pillars; and forming at least one cavity into said molding layer and contacting said bottommost redistribution layer to complete said mold interconnect substrate.

8. The method according to claim 7 wherein said redistribution layers comprise copper.

9. The method according to claim 7 wherein said first copper pillars have a height of at least 20 μm and wherein said second copper pillars have a height of at least 80 μm.

10. The method according to claim 7 wherein said forming said at least one cavity is by chemical or laser drilling.

11. The method according to claim 7 further comprising:

mounting at least one passive component onto said at least one copper pillar on said top side of said substrate wherein said at least one passive component electrically contacts said redistribution layers;

embedding said at least one passive component in a molding compound;

grinding said molding compound to a desired thickness; and mounting at least one silicon die having a top side and a bottom side in said cavity in said bottom side of said substrate wherein electrical connections are made between said top side of said at least one silicon die and said at least one passive component through said redistribution layers and wherein said bottom side of said at least one silicon die is exposed at a bottom of said package.

12. The method according to claim 11 wherein said mounting said at least one silicon die uses no flow underfill flux.

13. The method according to claim 11 after said mounting said at least one silicon die, further comprising applying underfill into said cavity between said at least one die and said bottommost metal layer.

14. The method according to claim 11 further comprising:

mounting at least one solder ball on said at least one copper pillar on said bottom side of said substrate wherein said at least one solder ball provides package output.

15. The method according to claim 11 wherein said at least one copper pillar on said bottom side of said substrate provides package output.

* * * * *